US012495509B2

(12) United States Patent
Roberts et al.

(10) Patent No.: US 12,495,509 B2
(45) Date of Patent: Dec. 9, 2025

(54) POWER SYSTEMS IN A MODULAR SYSTEM

(71) Applicant: Milwaukee Electric Tool Corporation, Brookfield, WI (US)

(72) Inventors: Alec C. Roberts, Milwaukee, WI (US); Kyle J. Radovich, West Bend, WI (US); Jack Braun, Richfield, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 270 days.

(21) Appl. No.: 18/332,102

(22) Filed: Jun. 9, 2023

(65) Prior Publication Data

US 2024/0040722 A1 Feb. 1, 2024

Related U.S. Application Data

(60) Provisional application No. 63/392,583, filed on Jul. 27, 2022.

(51) Int. Cl.
*H05K 5/02* (2006.01)
*H05K 5/00* (2006.01)

(52) U.S. Cl.
CPC ......... *H05K 5/0217* (2013.01); *H05K 5/0086* (2013.01)

(58) Field of Classification Search
CPC ........................... H05K 5/0217; H05K 5/0086
See application file for complete search history.

(56) References Cited

U.S. PATENT DOCUMENTS 3,424,334 A 1/1969 Goltz
5,890,613 A 4/1999 Williams
6,983,946 B2 1/2006 Sullivan et al.
7,367,571 B1 5/2008 Nichols
7,373,710 B2 5/2008 Elsworthy
8,084,992 B2 12/2011 Scheffy et al.
8,567,796 B2 10/2013 Bar-Erez et al.
8,740,010 B1 6/2014 Page
8,839,956 B2 9/2014 Roehm et al.
8,936,258 B2 1/2015 Bar-Erez et al.
9,132,543 B2 9/2015 Bar-Erez et al.
9,375,835 B1 6/2016 Lin
(Continued)

FOREIGN PATENT DOCUMENTS

CN 203521958 4/2014
CN 104485702 4/2015
(Continued)

OTHER PUBLICATIONS

Inter Partes Review No. 2024-01400, "Petition for Inter Partes Review of U.S. Pat. No. 11,365,026" Filed Sep. 17, 2024, 147 pages.

(Continued)

*Primary Examiner* — Sagar Shrestha

(74) *Attorney, Agent, or Firm* — Reinhart Boerner Van Deuren s.c.

(57) ABSTRACT

Various power systems that couple within a modular system are shown. In one example, a power system includes a plurality of male couplers arranged along a bottom of the power system, the male couplers configured to couple to utility modules in the modular system. In another example, the power system includes one or more coupling mechanisms configured to couple the power system to a transportation device.

20 Claims, 15 Drawing Sheets

(56) References Cited

U.S. PATENT DOCUMENTS

| | | | |
|---|---|---|---|
| 9,381,640 | B2 | 7/2016 | Van Der Linde et al. |
| 9,566,990 | B2 | 2/2017 | Bar-Erez et al. |
| 9,643,629 | B2 | 5/2017 | Bar-Erez et al. |
| 10,106,180 | B2 | 10/2018 | Bar-Erez et al. |
| 10,293,476 | B2 | 5/2019 | Fleischmann |
| 10,377,401 | B2 | 8/2019 | Thibault |
| 10,575,417 | B2 | 2/2020 | Sabbag et al. |
| 10,583,962 | B2 | 3/2020 | Brunner et al. |
| 10,750,833 | B2 | 8/2020 | Burchia |
| 10,962,218 | B2 | 3/2021 | Plato et al. |
| 2003/0139080 | A1 | 7/2003 | Lafragette et al. |
| 2006/0006838 | A1 | 1/2006 | Clarke |
| 2007/0138041 | A1 | 6/2007 | Welsh |
| 2011/0260588 | A1 | 10/2011 | Lin |
| 2013/0048631 | A1 | 2/2013 | Van Der Linde et al. |
| 2013/0051080 | A1 | 2/2013 | Van Der Linde et al. |
| 2013/0058711 | A1 | 3/2013 | Van Der Linde et al. |
| 2013/0127129 | A1 | 5/2013 | Bensman et al. |
| 2013/0134276 | A1 | 5/2013 | Van Der Linde et al. |
| 2014/0265440 | A1 | 9/2014 | Chen et al. |
| 2015/0078811 | A1 | 3/2015 | Van Der Linde et al. |
| 2017/0151972 | A1 | 6/2017 | Bar-Erez et al. |
| 2017/0166352 | A1 | 6/2017 | Hoppe et al. |
| 2017/0259956 | A1 | 9/2017 | Hori et al. |
| 2018/0161975 | A1* | 6/2018 | Brunner .................... B62B 1/14 |
| 2018/0183250 | A1 | 6/2018 | Byrne et al. |
| 2018/0186513 | A1 | 7/2018 | Brunner |
| 2019/0106244 | A1 | 4/2019 | Brunner et al. |
| 2019/0168376 | A1* | 6/2019 | Brocket ................. B25H 3/021 |
| 2019/0225371 | A1 | 7/2019 | Hoppe et al. |
| 2019/0270467 | A1 | 9/2019 | Thibault |
| 2020/0147781 | A1 | 5/2020 | Squiers et al. |
| 2020/0165036 | A1 | 5/2020 | Squiers et al. |
| 2020/0284425 | A1* | 9/2020 | Plato ....................... F21V 21/30 |
| 2021/0155374 | A1 | 5/2021 | Brunner et al. |
| 2021/0300447 | A1 | 9/2021 | Brunner |
| 2021/0360803 | A1 | 11/2021 | Semon et al. |
| 2023/0122425 | A1 | 4/2023 | Camp et al. |

FOREIGN PATENT DOCUMENTS

| | | | |
|---|---|---|---|
| CN | 204290394 | | 4/2015 |
| CN | 204431220 | | 7/2015 |
| CN | 206465063 | | 9/2017 |
| CN | 207753357 | | 8/2018 |
| CN | 109066418 | | 12/2018 |
| CN | 208428223 | | 1/2019 |
| CN | 208514468 | | 2/2019 |
| CN | 209717666 | | 12/2019 |
| DE | 102012213047 | | 1/2014 |
| DE | 202014103695 | | 10/2014 |
| EP | 1724069 | A2 | 11/2006 |
| EP | 2537641 | B1 | 9/2016 |
| EP | 2338650 | B1 | 10/2016 |
| EP | 3189944 | | 6/2018 |
| EP | 3189943 | | 1/2019 |
| GB | 2211486 | | 7/1989 |
| WO | WO2014/125484 | | 8/2014 |
| WO | WO16096408 | | 6/2016 |

OTHER PUBLICATIONS

Exhibit 1001 in Petition for Inter Partes Review of U.S. Pat. No. 11,365,026 Filed Sep. 17, 2024, 66 pages.
Exhibit 1002 in Petition for Inter Partes Review of U.S. Pat. No. 11,365,026 Filed Sep. 17, 2024, 324 pages.
Exhibit 1003 in Petition for Inter Partes Review of U.S. Pat. No. 11,365,026 Filed Sep. 17, 2024, 139 pages.
Exhibit 1004 in Petition for Inter Partes Review of U.S. Pat. No. 11,365,026 Filed Sep. 17, 2024, 17 pages.
Exhibit 1005 in Petition for Inter Partes Review of U.S. Pat. No. 11,365,026 Filed Sep. 17, 2024, 9 pages.
Exhibit 1006 in Petition for Inter Partes Review of U.S. Pat. No. 11,365,026 Filed Sep. 17, 2024, 21 pages.
Exhibit 1007 in Petition for Inter Partes Review of U.S. Pat. No. 11,365,026 Filed Sep. 17, 2024, 16 pages.
Exhibit 1008 in Petition for Inter Partes Review of U.S. Pat. No. 11,365,026 Filed Sep. 17, 2024, 31 pages.
Exhibit 1009 in Petition for Inter Partes Review of U.S. Pat. No. 11,365,026 Filed Sep. 17, 2024, 6 pages.
Exhibit 1010 in Petition for Inter Partes Review of U.S. Pat. No. 11,365,026 Filed Sep. 17, 2024, 4 pages.
Exhibit 1011 in Petition for Inter Partes Review of U.S. Pat. No. 11,365,026 Filed Sep. 17, 2024, 16 pages.
Exhibit 1012 in Petition for Inter Partes Review of U.S. Pat. No. 11,365,026 Filed Sep. 17, 2024, 8 pages.
Exhibit 1013 in Petition for Inter Partes Review of U.S. Pat. No. 11,365,026 Filed Sep. 17, 2024, 19 pages.
Exhibit 1014 in Petition for Inter Partes Review of U.S. Pat. No. 11,365,026 Filed Sep. 17, 2024, 35 pages.
Exhibit 1015 in Petition for Inter Partes Review of U.S. Pat. No. 11,365,026 Filed Sep. 17, 2024, 11 pages.
Exhibit 1016 in Petition for Inter Partes Review of U.S. Pat. No. 11,365,026 Filed Sep. 17, 2024, 193 pages.
Exhibit 1017 in Petition for Inter Partes Review of U.S. Pat. No. 11,365,026 Filed Sep. 17, 2024, 29 pages.
Exhibit 1018 in Petition for Inter Partes Review of U.S. Pat. No. 11,365,026 Filed Sep. 17, 2024, 15 pages.
Exhibit 1019 in Petition for Inter Partes Review of U.S. Pat. No. 11,365,026 Filed Sep. 17, 2024, 19 pages.
Exhibit 1020 in Petition for Inter Partes Review of U.S. Pat. No. 11,365,026 Filed Sep. 17, 2024, 18 pages.
Exhibit 1021 in Petition for Inter Partes Review of U.S. Pat. No. 11,365,026 Filed Sep. 17, 2024, 313 pages.
Exhibit 1030 in Petition for Inter Partes Review of U.S. Pat. No. 11,365,026 Filed Sep. 17, 2024, 95 pages.
Exhibit 1031 in Petition for Inter Partes Review of U.S. Pat. No. 11,365,026 Filed Sep. 17, 2024, 5 pages.
Exhibit 1032 in Petition for Inter Partes Review of U.S. Pat. No. 11,365,026 Filed Sep. 17, 2024, 19 pages.
Inter Partes Review No. 2024-01401, "Petition for Inter Partes Review of U.S. Pat. No. 11,794,952" Filed Sep. 17, 2024, 165 pages.
Exhibit 1001 in Petition for Inter Partes Review of U.S. Pat. No. 11,794,952 Filed Sep. 17, 2024, 67 pages.
Exhibit 1002 Part 1 in Petition for Inter Partes Review of U.S. Pat. No. 11,794,952 Filed Sep. 17, 2024, 227 pages.
Exhibit 1002 Part 2 in Petition for Inter Partes Review of U.S. Pat. No. 11,794,952 Filed Sep. 17, 2024, 278 pages.
Exhibit 1003 in Petition for Inter Partes Review of U.S. Pat. No. 11,794,952 Filed Sep. 17, 2024, 168 pages.
Exhibit 1004 in Petition for Inter Partes Review of U.S. Pat. No. 11,794,952 Filed Sep. 17, 2024, 17 pages.
Exhibit 1005 in Petition for Inter Partes Review of U.S. Pat. No. 11,794,952 Filed Sep. 17, 2024, 9 pages.
Exhibit 1006 in Petition for Inter Partes Review of U.S. Pat. No. 11,794,952 Filed Sep. 17, 2024, 21 pages.
Exhibit 1007 in Petition for Inter Partes Review of U.S. Pat. No. 11,794,952 Filed Sep. 17, 2024, 16 pages.
Exhibit 1008 in Petition for Inter Partes Review of U.S. Pat. No. 11,794,952 Filed Sep. 17, 2024, 31 pages.
Exhibit 1009 in Petition for Inter Partes Review of U.S. Pat. No. 11,794,952 Filed Sep. 17, 2024, 6 pages.
Exhibit 1010 in Petition for Inter Partes Review of U.S. Pat. No. 11,794,952 Filed Sep. 17, 2024, 4 pages.
Exhibit 1011 in Petition for Inter Partes Review of U.S. Pat. No. 11,794,952 Filed Sep. 17, 2024, 16 pages.
Exhibit 1012 in Petition for Inter Partes Review of U.S. Pat. No. 11,794,952 Filed Sep. 17, 2024, 8 pages.
Exhibit 1013 in Petition for Inter Partes Review of U.S. Pat. No. 11,794,952 Filed Sep. 17, 2024, 19 pages.
Exhibit 1014 in Petition for Inter Partes Review of U.S. Pat. No. 11,794,952 Filed Sep. 17, 2024, 35 pages.
Exhibit 1015 in Petition for Inter Partes Review of U.S. Pat. No. 11,794,952 Filed Sep. 17, 2024, 11 pages.

(56) References Cited

OTHER PUBLICATIONS

Exhibit 1016 in Petition for Inter Partes Review of U.S. Pat. No. 11,794,952 Filed Sep. 17, 2024, 193 pages.
Exhibit 1017 in Petition for Inter Partes Review of U.S. Pat. No. 11,794,952 Filed Sep. 17, 2024, 29 pages.
Exhibit 1018 in Petition for Inter Partes Review of U.S. Pat. No. 11,794,952 Filed Sep. 17, 2024, 15 pages.
Exhibit 1019 in Petition for Inter Partes Review of U.S. Pat. No. 11,794,952 Filed Sep. 17, 2024, 19 pages.
Exhibit 1020 in Petition for Inter Partes Review of U.S. Pat. No. 11,794,952 Filed Sep. 17, 2024, 18 pages.
Exhibit 1021 in Petition for Inter Partes Review of U.S. Pat. No. 11,794,952 Filed Sep. 17, 2024, 313 pages.
Exhibit 1022 in Petition for Inter Partes Review of U.S. Pat. No. 11,794,952 Filed Sep. 17, 2024, 324 pages.
Exhibit 1023 in Petition for Inter Partes Review of U.S. Pat. No. 11,794,952 Filed Sep. 17, 2024, 5 pages.
Exhibit 1024 in Petition for Inter Partes Review of U.S. Pat. No. 11,794,952 Filed Sep. 17, 2024, 7 pages.
Exhibit 1025 in Petition for Inter Partes Review of U.S. Pat. No. 11,794,952 Filed Sep. 17, 2024, 15 pages.
Exhibit 1026 in Petition for Inter Partes Review of U.S. Pat. No. 11,794,952 Filed Sep. 17, 2024, 37 pages.
Exhibit 1027 in Petition for Inter Partes Review of U.S. Pat. No. 11,794,952 Filed Sep. 17, 2024, 7 pages.
Exhibit 1028 in Petition for Inter Partes Review of U.S. Pat. No. 11,794,952 Filed Sep. 17, 2024, 33 pages.
Exhibit 1030 in Petition for Inter Partes Review of U.S. Pat. No. 11,794,952 Filed Sep. 17, 2024, 95 pages.
Exhibit 1031 in Petition for Inter Partes Review of U.S. Pat. No. 11,794,952 Filed Sep. 17, 2024, 5 pages.
Exhibit 1032 in Petition for Inter Partes Review of U.S. Pat. No. 11,794,952 Filed Sep. 17, 2024, 60 pages.

* cited by examiner

POWER SYSTEMS IN A MODULAR SYSTEM

CROSS-REFERENCE TO RELATED PATENT APPLICATION

The present application claims the benefit of and priority to U.S. Provisional Application No. 63/392,583, filed on Jul. 27, 2022, which is incorporated herein by reference in its entirety.

BACKGROUND OF THE INVENTION

The present disclosure relates generally to the field of utility modules in modular systems. The present disclosure relates specifically to a modular, portable system that supplies power.

Utility modules in modular systems are often used to transport tools and tool accessories. Within a modular storage system, different systems, units, devices and/or containers may provide varying functions, such as being adapted to provide power and/or recharge batteries, such as rechargeable power tool batteries.

SUMMARY OF THE INVENTION

One embodiment of the invention relates to a power system including a power unit and a coupling structure mechanically and reversibly detachably coupled to the power unit. The power unit includes a housing defining a lower surface, an upper surface opposite the lower surface, a height between the upper surface and lower surface, a power source within the housing, and a power tool battery interface configured to couple to a rechargeable power tool battery and provide power from the power source to the rechargeable power tool battery. The coupling structure extends vertically at least the height upward from below the lower surface of the power unit. The coupling structure includes a plurality of male couplers. Each of the plurality of male couplers includes a body extending below and away from the lower surface, a first tongue, and a second tongue, the first tongue and the second tongue each extending from opposing sides of the body and each offset from the lower surface, the first tongue defining a first channel between the lower surface and the first tongue, the second tongue defining a second channel between the lower surface and the second tongue, and each channel including a front open end and a back closed end. The plurality of male couplers are configured to detachably couple the coupling structure to a utility module.

Another embodiment of the invention relates to a power system including a power unit, a frame, a plate coupled to the frame, and a plurality of male couplers. The power unit includes a housing defining a first lower surface, a power source within the housing, and a power tool battery interface configured to couple to a rechargeable power tool battery and provide power from the power source to the rechargeable power tool battery. The frame defines an empty internal volume that the frame surrounds, the power unit being at least partially disposed within the internal volume. The plate is coupled to the frame. The plate supports the first lower surface of the power unit. The plate defines a second lower surface facing away from the power unit. Each of the plurality of male couplers include a body extending below and away from the second lower surface, a first tongue, and a second tongue. The first tongue and the second tongue each extend from opposing sides of the body and each offset from the second lower surface. The first tongue defines a first channel between the second lower surface and the first tongue, the second tongue defines a second channel between the second lower surface and the second tongue. Each channel includes a front open end and a back closed end, the plurality of male couplers configured to detachably couple the plate to a utility module.

Another embodiment of the invention relates to a coupling structure including a frame configured to detachably couple around a first utility module such that the first utility module is at least partially disposed within an empty internal volume that the frame surrounds, a plate coupled to the frame, the plate supporting a lower surface of the first utility module, and a plurality of male couplers. Each of the plurality of male couplers includes a body extending downward, a first tongue, and a second tongue. The first tongue and the second tongue each extend from opposing sides of the body. The first tongue defines a first channel above the first tongue, and the second tongue defines a second channel above the second tongue. Each channel includes a front open end and a back closed end, the plurality of male couplers configured to detachably couple the frame to a second utility module.

Another embodiment of the invention relates to a power system including a power unit and a coupling structure coupled to the power unit. The power unit includes a housing defining a bottom surface, a power source within the housing, and a power output. In various embodiments the power output is a coupling mechanism configured to couple to a rechargeable power tool battery and provide power from the power source to the rechargeable power tool battery. The coupling structure includes a plurality of male couplers configured to couple the power system to a utility module. The plurality of male couplers each include a body below the bottom surface, a first tongue, and a second tongue. The first tongue and the second tongue both extend from the body and both are offset from and above the bottom surface. The first tongue defines a first channel between the bottom surface and the first tongue. The second tongue defines a second channel between the bottom surface and the second tongue. The first channel and second channel each extend on opposing sides of the body. Each channel includes a front open end and a back closed end.

In various embodiments, the housing of the power unit defines an upper surface including a plurality of female couplers. Each of the plurality of female couplers includes a recessed surface, a first rib, and a second rib. The first rib and the second rib each extend over the recessed surface, and each of the plurality of female couplers are configured for arresting engagement with male couplers of a utility module.

In various embodiments, each of the plurality of female couplers includes a backwall, a first sidewall, a second sidewall, and a front wall extending upward from the recessed surface. The first rib extends from the backwall towards the front wall and the first rib extends from the first sidewall towards the second sidewall. The second rib extends from the backwall towards the front wall and the second rib extends from the second sidewall towards the first sidewall.

Another embodiment of the invention relates to a power system including a power unit and a coupling structure coupled to the power unit. The power unit includes a housing defining a bottom surface, a power source within the housing, and a coupling mechanism configured to couple to a rechargeable power tool battery and provide power from the power source to the rechargeable power tool battery. The coupling structure includes a first latch and a second latch coupled to the coupling structure. An end of the first latch (e.g., a hook) is biased towards the second latch, and an end of the second latch (e.g., a hook) is biased towards the first latch.

In various embodiments, the power system includes a transportation device including one or more arms. The end of the first latch and the end of the second latch are configured to engage against the one or more arms, thereby coupling the coupling structure to the transportation device.

Additional features and advantages will be set forth in the detailed description which follows, and, in part, will be readily apparent to those skilled in the art from the description or recognized by practicing the embodiments as described in the written description included, as well as the appended drawings. It is to be understood that both the foregoing general description and the following detailed description are exemplary.

The accompanying drawings are included to provide further understanding and are incorporated in and constitute a part of this specification. The drawings illustrate one or more embodiments and, together with the description, serve to explain principles and operation of the various embodiments.

BRIEF DESCRIPTION OF THE DRAWINGS

This application will become more fully understood from the following detailed description, taken in conjunction with the accompanying figures, wherein like reference numerals refer to like elements in which.

DETAILED DESCRIPTION

Figure 1:
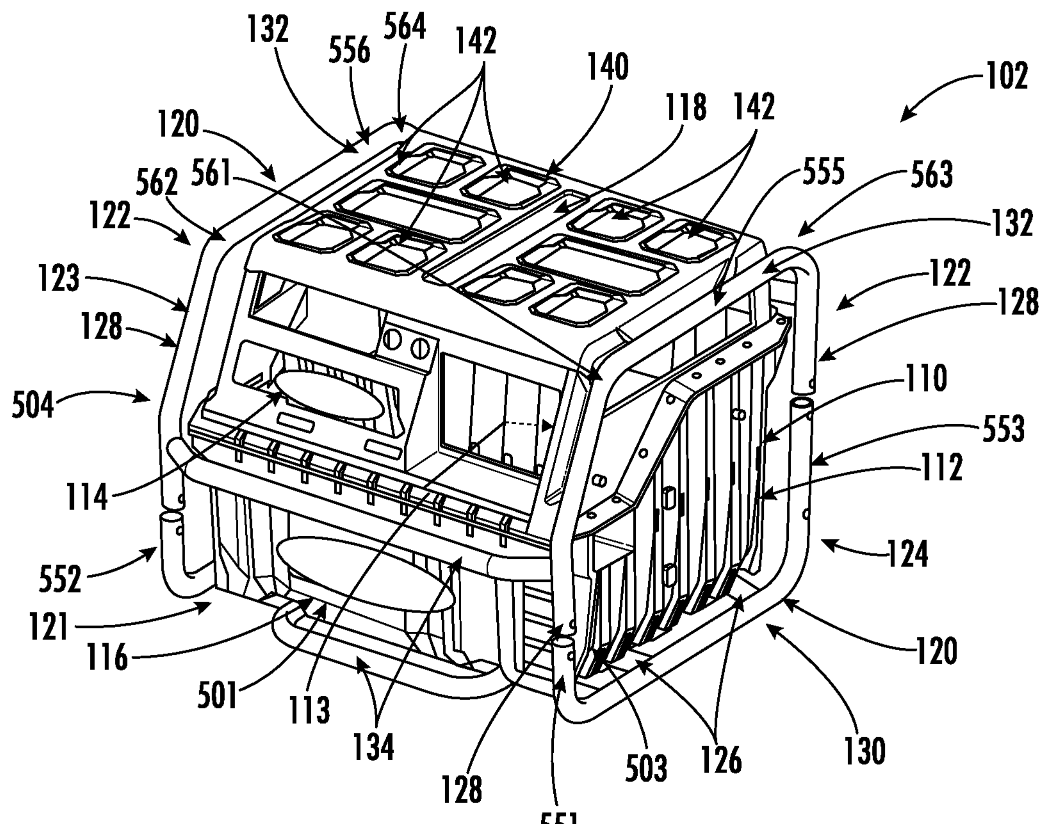
FIG. 1 is a perspective view of a power system, according to an exemplary embodiment.
Figure 2:
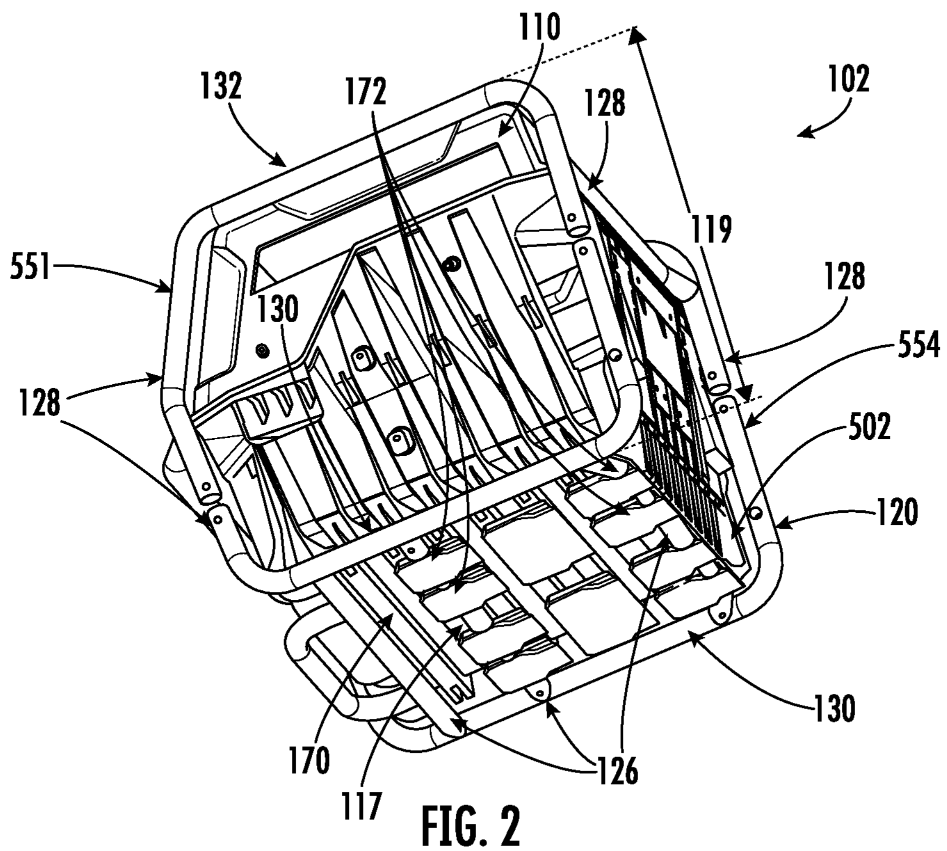
FIG. 2 is a perspective view of the power system of FIG. 1, according to an exemplary embodiment.

Referring generally to the figures, various embodiments of power systems configured to couple within a modular system are shown. Various utility modules within the modular system provide different functions, such as providing power and/or facilitating transportation of other utility modules within the modular system. Applicant has developed power systems configured to couple to other utility modules within the modular system, such as being configured to couple to transportation devices within the modular system.

The term 'utility module' is used hereinafter in its broad meaning and is meant to denote a variety of articles such as, storage containers, travel luggage, tool boxes, organizers, compacted work benches, cable storage, tools (e.g. hand tools, power generators and power sources), communication modules, carrying platforms, locomotion platforms, etc., of any shape and size, and wherein any utility module can be detachably attached to any other utility module. The term 'utility assembly' as used herein denotes any set of utility modules configured for articulation to one another, either as a stationary unit or locomotive.

Referring to FIGS. 1-5, a utility module, shown as power system 102, is shown according to an exemplary embodiment. Power system 102 includes power unit 110 and coupling structure 120. Power unit 110 includes housing 112 defining a lower surface 117, an upper surface 118 opposite the lower surface 117, and a height 119 between lower surface 117 and upper surface 118. In various embodiments power unit 110 includes a power source, shown as battery 116, configured to provide power (e.g., electricity), such as by providing power from battery 116 via a power tool battery interface 114 coupled to housing 112. In various embodiments, power tool battery interface 114 includes a coupling mechanism configured to physically couple to a rechargeable power tool battery and provide power from battery 116 to the rechargeable power tool battery. In various embodiments, power unit 110 includes one or more power outputs, such as power tool battery interfaces 114, a power input (e.g., a cord to plug into a wall outlet), and/or a storage compartment.

In various embodiments, power unit 110 includes a front face 501, a rear face 502 opposite the front face 501, a first side face 503, and a second side face 504 opposite the first side face 503. In various embodiments, frame 123 of coupling structure 120 includes a first corner rail 551 in front of the front face 501 and the first side face 503, a second corner rail 552 in front of the front face 501 and the second side face 504, a third corner rail 553 in front of the rear face 502 and the first side face 503, and a fourth corner rail 554 in front of the rear face 502 and the second side face 504. Frame 123 of coupling structure 120 includes a first upper side rail 555 extending between a top 561 of the first corner rail 551 and a top 563 of the third corner rail 553, and a second upper side rail 556 extending between a top 562 of the second corner rail 552 and a top 564 of the fourth corner rail 554. Power unit 110 includes a storage compartment 113 configured to store a hand tool.

Coupling structure 120 is configured to mechanically and reversibly couple to power unit 110 and to couple to transportation devices in a modular system. In various embodiments, coupling structure 120 extends vertically at least height 119 upward from below the lower surface 117 of the power unit 110. In various embodiments, frame 123 of coupling structure 120 does not extend above the upper surface 118 of the power unit 110 opposite the lower surface 117.

In various embodiments, frame 123 of coupling structure 120 defines an empty internal volume 121 that coupling structure 120 surrounds, such as via frame 123 surrounding internal volume 121. For example, corner rail 551, corner rail 554 opposite corner rail 551, corner rail 552, and corner rail 553 opposite corner rail 552 collectively define the internal volume 121. In various embodiments, power unit 110 is at least partially disposed within the internal volume 121. In various embodiments, power unit 110 is disposed entirely within the internal volume 121.

In various embodiments, frame 123 of coupling structure 120 surrounds most of power unit 110 (e.g., except for upper surface 140). In various embodiments, coupling structure 120 is formed from one or more elongate structures (e.g., pipes or tubes) including an upper portion 122 and a lower portion 124. Coupling structure 120 includes one or more elongate structures, shown as bars 126, extending along a bottom of coupling structure 120 and underneath power unit 110.

In various embodiments, coupling structure 120 includes vertical bars 128 arranged at one or more of the lateral corners of the coupling structure 120 (e.g., each of the four lateral corners), lower bars 130 that extend along one or more of the lower corners of the coupling structure 120 (e.g., the lower corners on each side of the coupling structure 120), upper bars 132 that extend along one or more of the upper corners of the coupling structure 120 (e.g., the upper corners on each side of the coupling structure 120), and front rail 134 extending at a front of the front face 501 of power unit 110 and the front of coupling structure 120. In various embodiments, front rail 134 extends between first corner rail 551 and second corner rail 552.

Upper surface 140 of housing 112 defines one or more female couplers 142. Coupling structure 120 and bottom surface 170 of power unit 110 collectively define one or more male couplers 172 (e.g., a plurality of male couplers 172). In a specific embodiment, female couplers 142 and/or male couplers 172 are compatible with the coupling mechanism(s) described in International Patent International Patent Publication No. WO 2017/191628, which is hereby incorporated by reference in its entirety.

Figure 3:
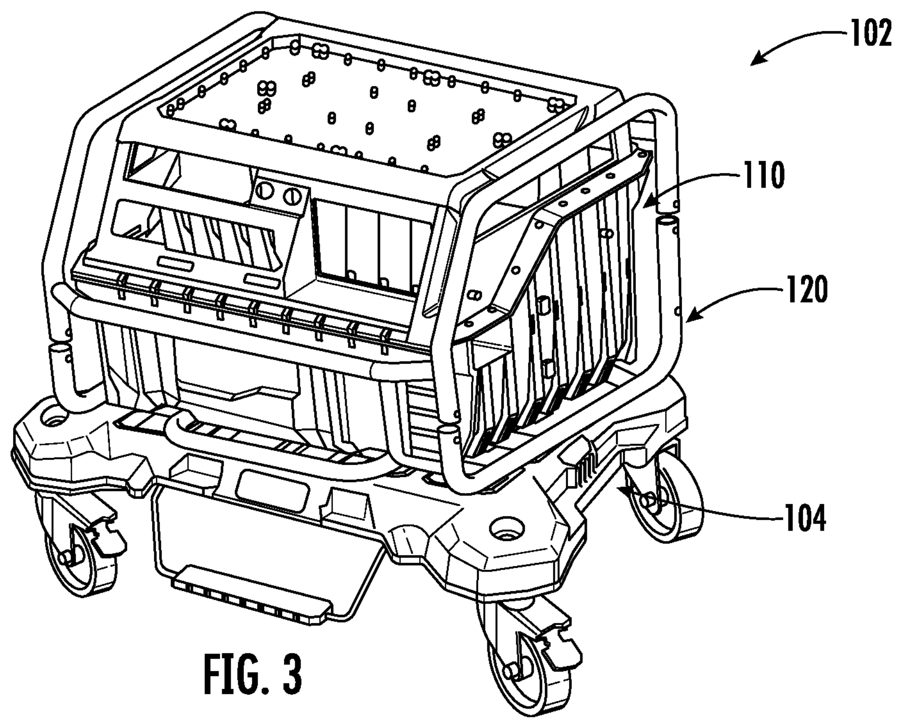
FIG. 3 is a perspective view of the power system of FIG. 1 shown coupled to a cart, according to an exemplary embodiment.
Figure 4:
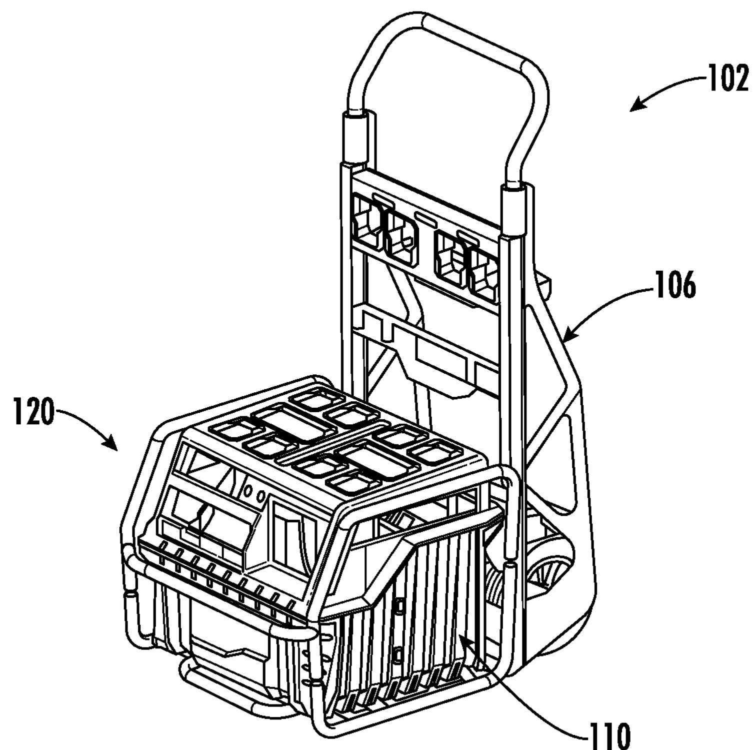
FIG. 4 is a perspective view of the power system of FIG. 1 shown coupled to a dolly, according to an exemplary embodiment.

Referring to FIGS. 3-4, male couplers 172 are configured to detachably couple power system 102 to transportation devices, such as to cart 104 or dolly 106, and male couplers 171 are configured to detachably couple coupling structure 120 to a utility module. In particular, one or more of the male couplers 172 engage with corresponding female couplers on the cart 104 or dolly 106 to secure power system 102 to the cart 104 or dolly 106.

Figure 19:
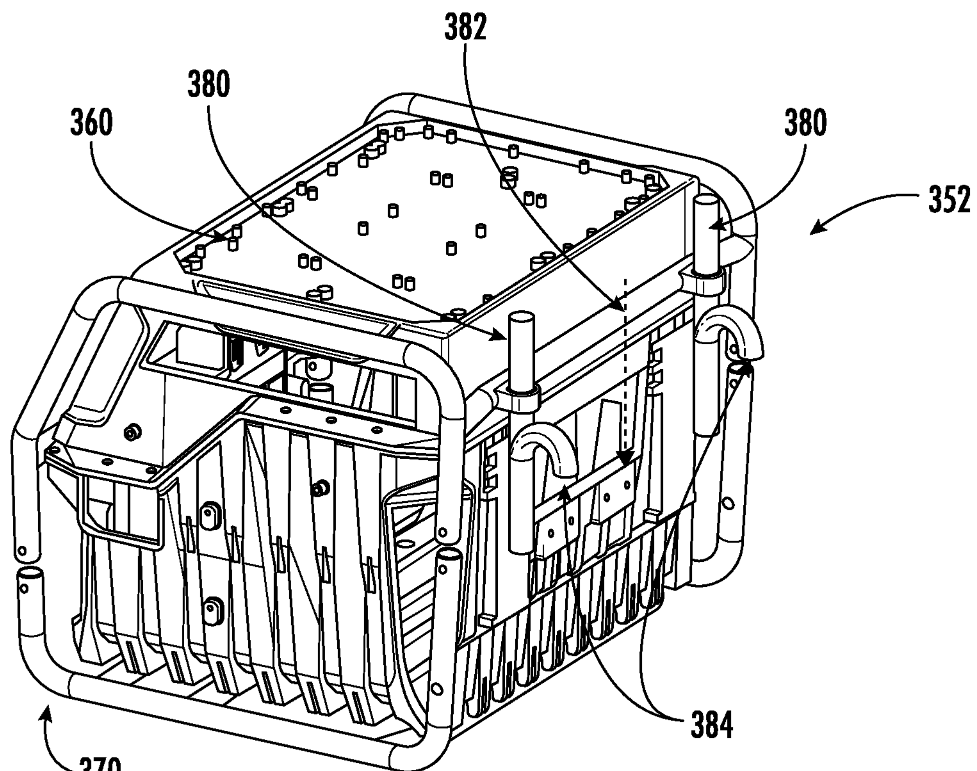
FIG. 19 is a perspective view of a power system, according to an exemplary embodiment.

In various embodiments, a hook extends from a rear of coupling structure, such as one of coupling mechanism 330 (FIG. 16) or coupling mechanism 380 (FIG. 19). In various embodiments the hook is spring-biased to couple the frame to a transportation unit, such as dolly 106 or cart 104.

Figure 5:
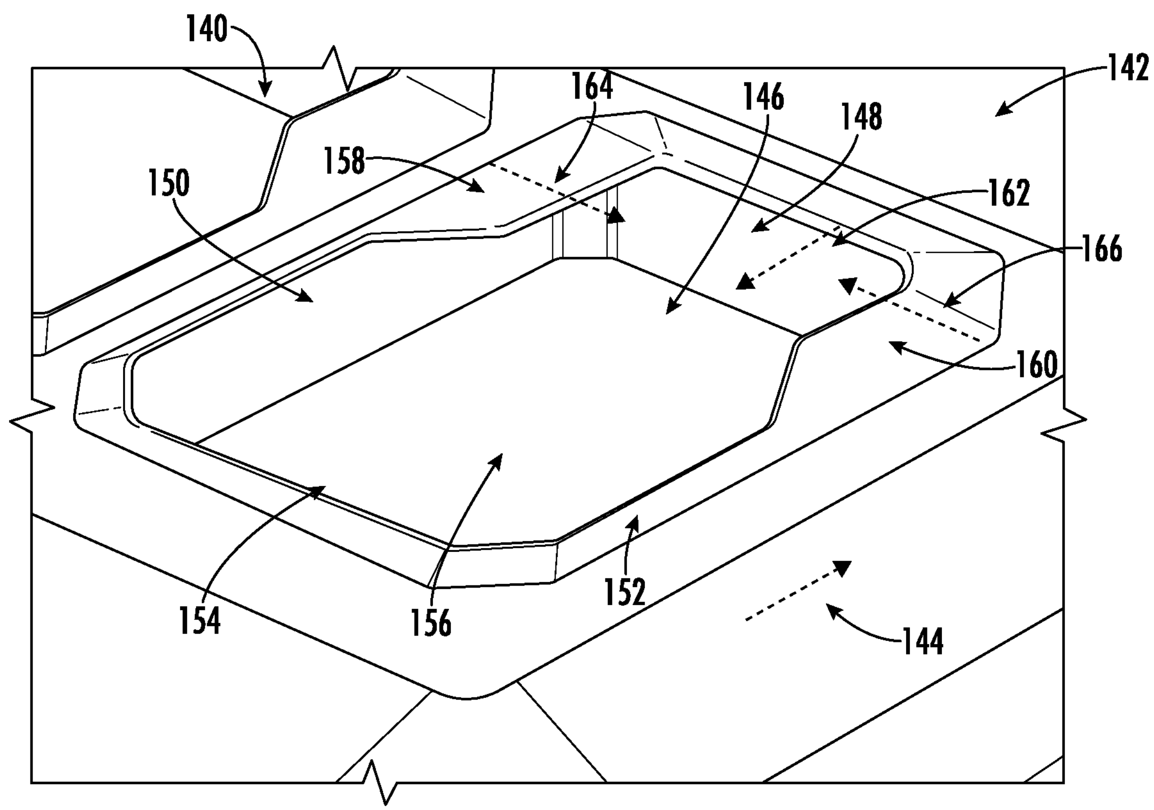
FIG. 5 is a detailed perspective view of a portion of the power system of FIG. 1, according to an exemplary embodiment.

Referring to FIG. 5, various aspects of female coupler 142 are shown. Female coupler 142 includes a recessed surface 146 below top surface 140. Rear wall 148, opposing front wall 154, first side wall 150, and opposing second side wall 152 extend upward from recessed surface 146. Female coupler 142 includes a pocket 156 collectively defined by recessed surface 146, rear wall 148, front wall 154, first side wall 150, and second side wall 152.

In use, a utility module being coupled to power system 102 slides in direction 144 to couple the utility module to the power system 102. Stated another way, a male coupler on the utility module being coupled to female coupler 142 is moved in direction 144 with respect to female coupler 142 to couple the male coupler to the female coupler 142.

First rib 158 extends from rear wall 148 and first sidewall 150 above pocket 156 and/or recessed surface 146. In particular, first rib 158 extends in direction 164 from first sidewall 150 and first rib 158 extends in direction 162 from rear wall 148.

Second rib 160 extends from rear wall 148 and second sidewall 152 above pocket 156 and/or recessed surface 146. In particular, second rib 160 extends in direction 166 from second sidewall 152 and second rib 160 extends in direction 162 from rear wall 148.

Figure 6:
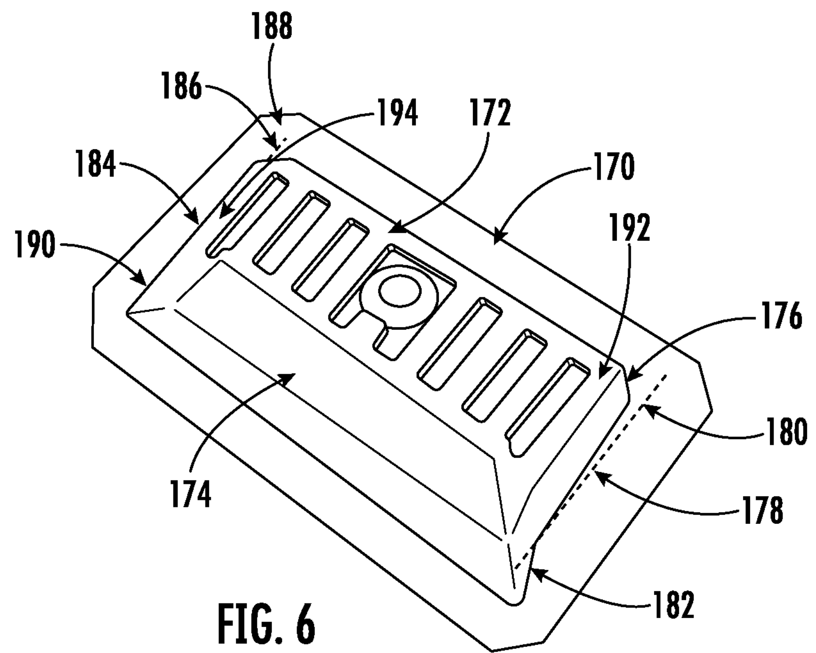
FIG. 6 is a detailed perspective view of a portion of the power system of FIG. 1, according to an exemplary embodiment.
Figure 7:
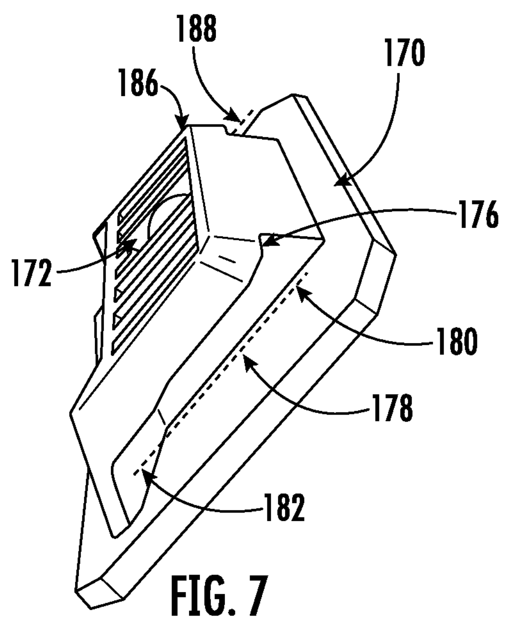
FIG. 7 is a detailed perspective view of a portion of the power system of FIG. 1, according to an exemplary embodiment.
Figure 8:
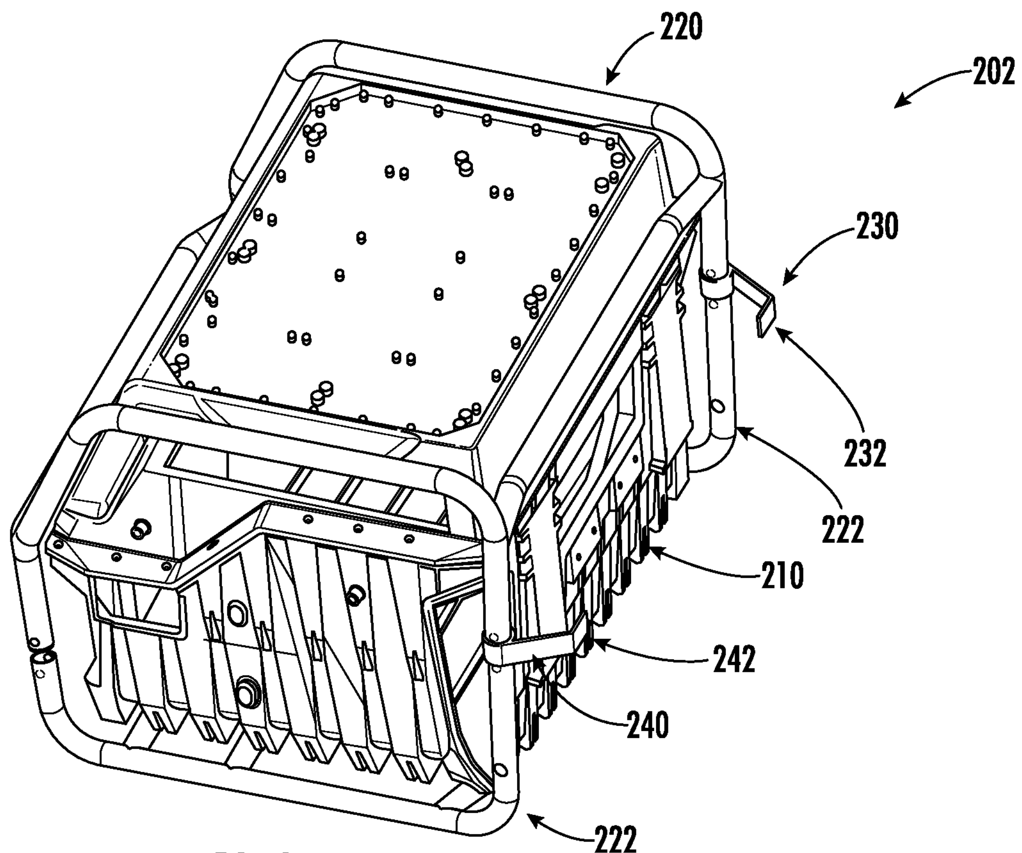
FIG. 8 is a perspective view of a power system, according to an exemplary embodiment.
Figure 9:
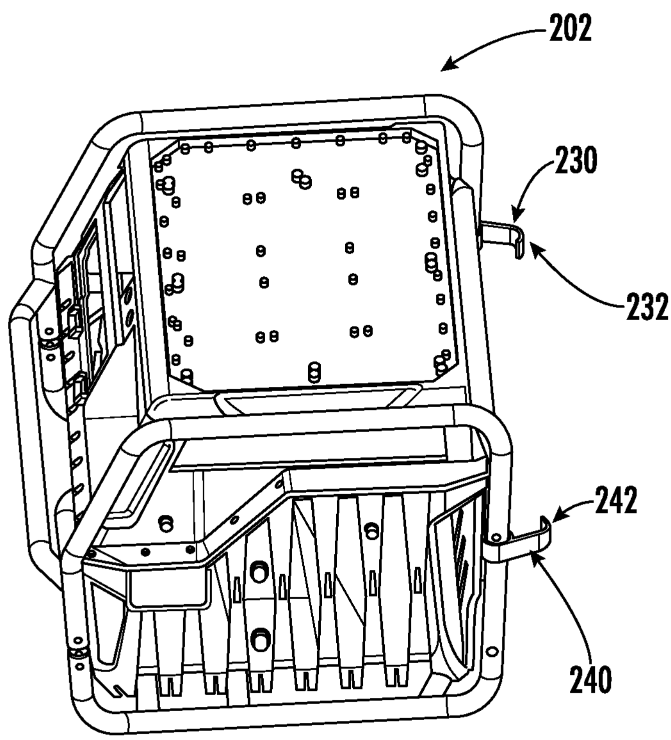
FIG. 9 is a perspective view of the power system of FIG. 8, according to an exemplary embodiment.

Referring to FIGS. 6-7, various aspects of male coupler 172 are shown. Male coupler 172 includes a body 174 (e.g., coupled to one of bars 126), a first tongue 176, and a second tongue 184. The first tongue 176 and the second tongue 184 both extend from the body 174 and both are offset from and above the bottom surface 170. The first tongue 176 defines a first channel 178 between the back surface 170 and the first tongue 176, and the second tongue 184 defines a second channel 186 between the back surface 170 and the second tongue 184. The first channel 178 and second channel 186 each extend on opposing sides (e.g., first side 192 and opposing second side 194) of the body 174.

Each of first channel 178 and second channel 186 includes a front open end and a back closed end. For example, first channel 178 includes a front open end 180 and a back closed end 182, and second channel 186 includes a front open end 188 and a back closed end 190.

In various embodiments, the female couplers 142 include a rib extending from the rear wall 148.

Referring to FIGS. 8-11, power system 202 is shown according to an exemplary embodiment. Power system 202 is substantially the same as power system 102 except for the differences discussed herein.

In particular, first latch 230 and second latch 240 are coupled to coupling structure 220, such as to vertical bars 222 of coupling structure 220. In various embodiments, two vertical bars 222 are both arranged on opposing sides of the back of coupling structure 220. In various embodiments, first latch 230 and second latch 240 are biased towards each other. In particular, end 232 of first latch 230 (e.g., a hook) is biased towards second latch 240, and end 242 of second latch 240 (e.g., a hook) is biased towards first latch 230.

Figure 10:
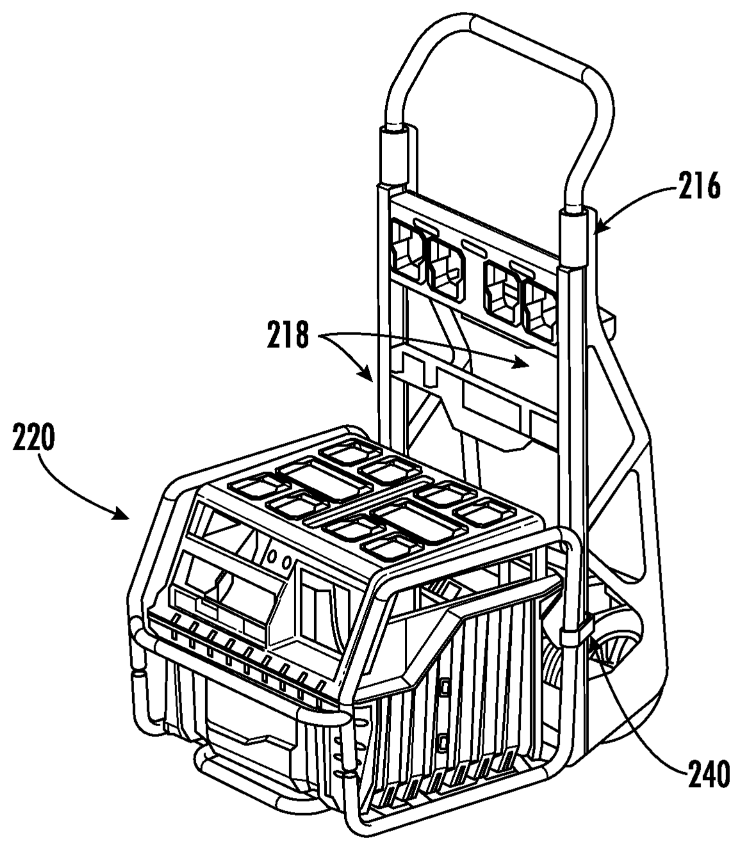
FIG. 10 is a perspective view of the power system of FIG. 8 shown coupled to a dolly, according to an exemplary embodiment.
Figure 11:
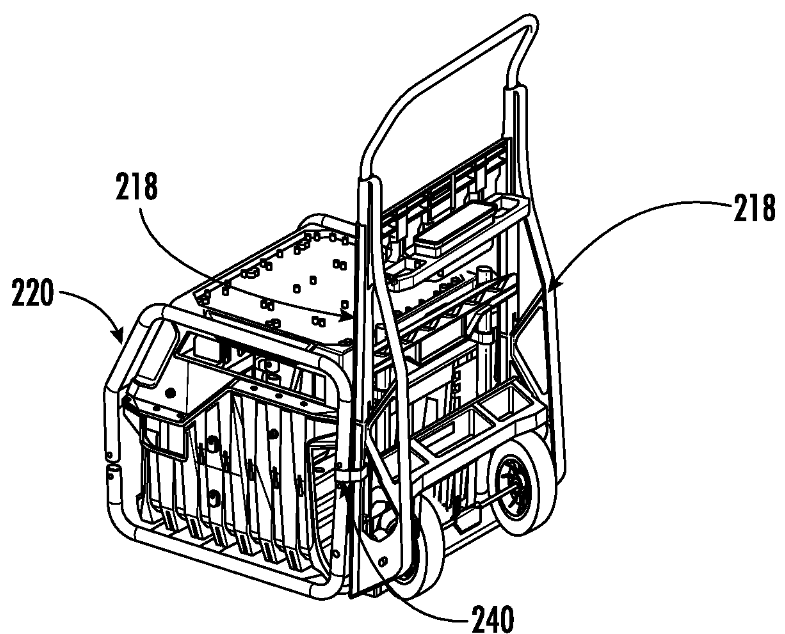
FIG. 11 is a perspective view of the power system of FIG. 8 shown coupled to a dolly, according to an exemplary embodiment.
Figure 12:
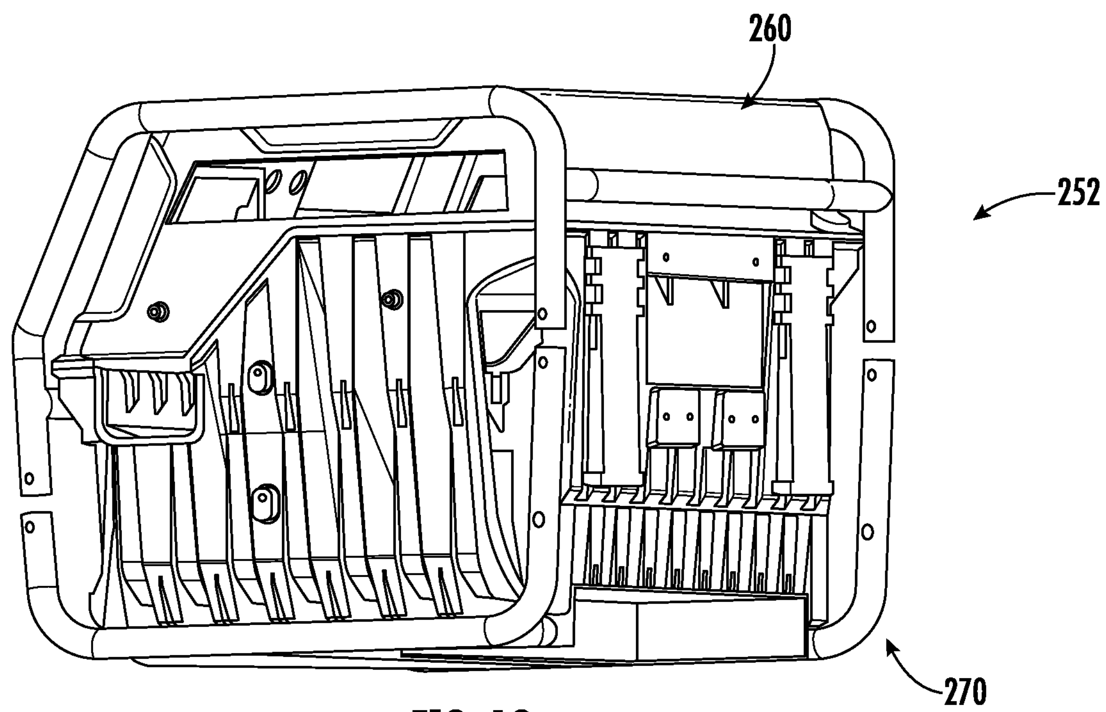
FIG. 12 is a perspective view of a power system, according to an exemplary embodiment.
Figure 13:
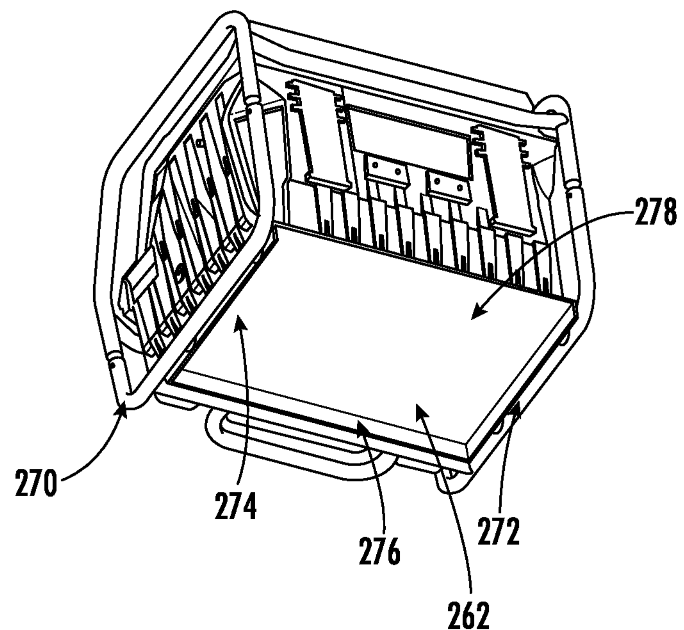
FIG. 13 is a perspective view of the power system of FIG. 12, according to an exemplary embodiment.

Referring to FIGS. 10-11, in use, first latch 230 and second latch 240 are coupled to a transportation device, such as arms 218 of dolly 216. As a result, power system 252 is coupled to dolly 216.

Referring to FIGS. 12-15, power system 252 is shown according to an exemplary embodiment. Power system 252 is substantially the same as power system 102 or power system 202 except for the differences discussed herein.

In particular, power unit 260 and coupling structure 270 define pocket 278 configured to secure power system 252 to a transportation device, such as dolly 266. In particular, first sidewall 272, second sidewall 274, and front wall 276 extend downward from power unit 260 below bottom surface 262. Pocket 278 is collectively defined by first sidewall 272, second sidewall 274, front wall 276, and bottom surface 262.

Figure 14:
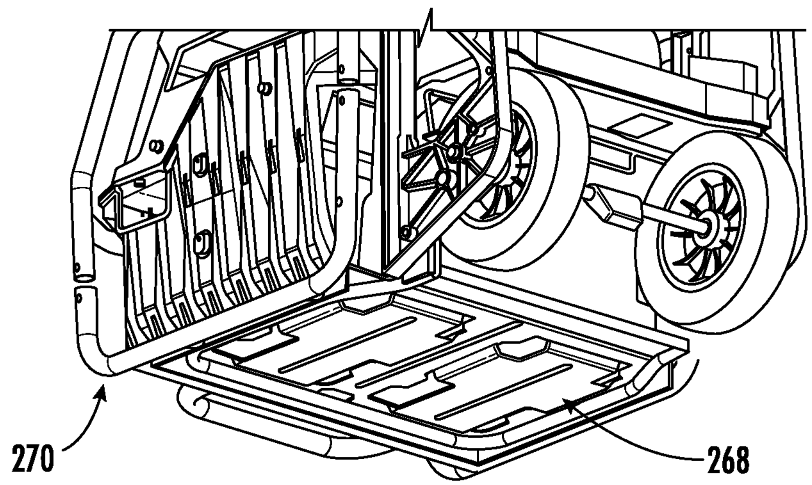
FIG. 14 is a perspective view of the power system of FIG. 12 shown coupled to a dolly, according to an exemplary embodiment.
Figure 15:
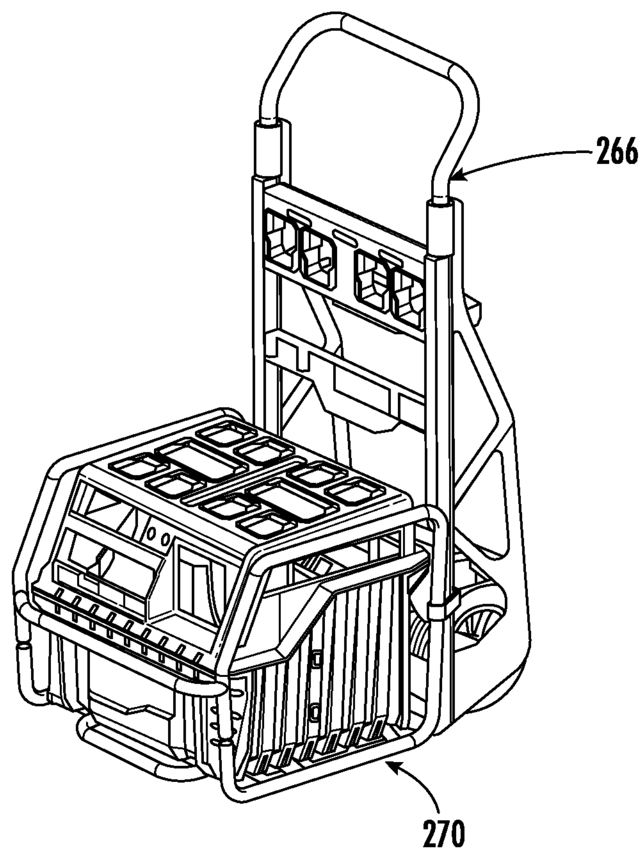
FIG. 15 is a perspective view of the power system of FIG. 12 shown coupled to a dolly, according to an exemplary embodiment.

Referring to FIGS. 14-15, bottom shelf 268 of dolly 266 is received within pocket 278, thereby resting power system 252 on dolly 266. As a result, power system 252 can be picked up by and moved by dolly 266. Pocket 278 may be used in cooperation with one or more other coupling structures described herein.

Figure 16:
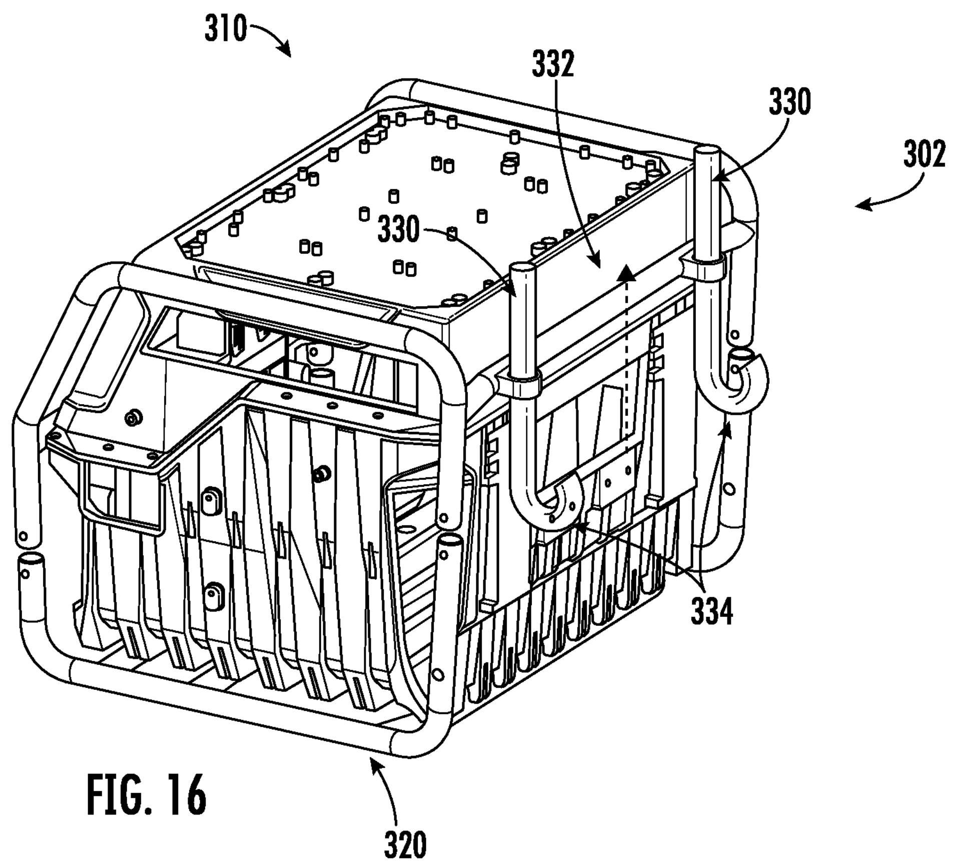
FIG. 16 is a perspective view of a power system, according to an exemplary embodiment.
Figure 17:
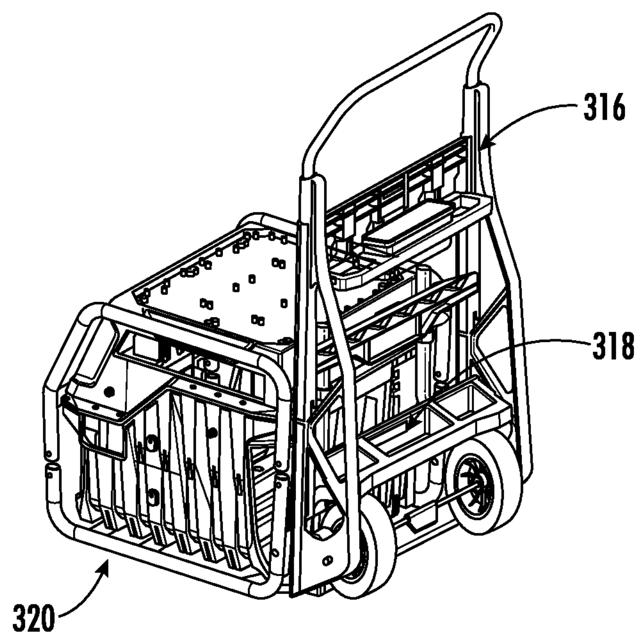
FIG. 17 is a perspective view of the power system of FIG. 16 shown coupled to a dolly, according to an exemplary embodiment.
Figure 18:
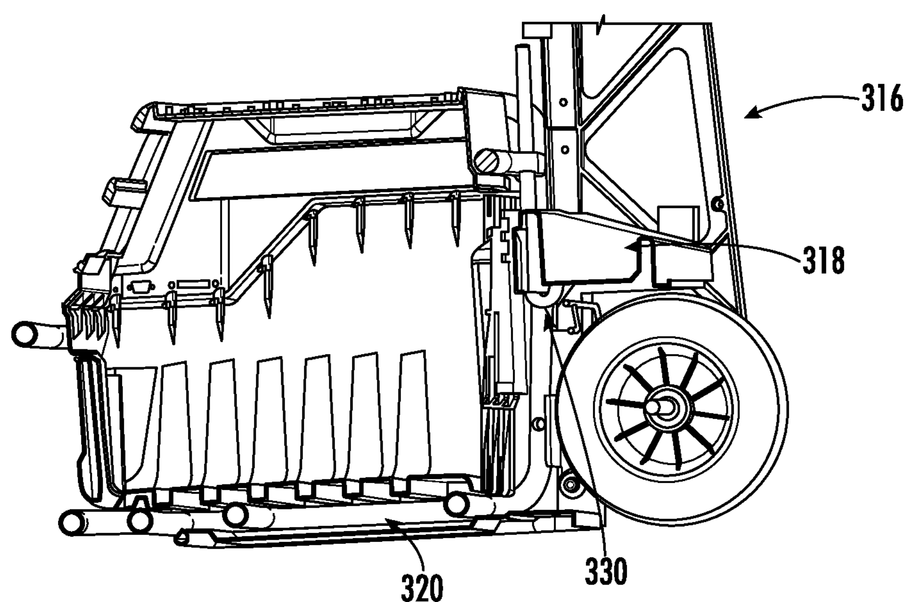
FIG. 18 is a side view of the power system of FIG. 16 shown coupled to a dolly, according to an exemplary embodiment.

Referring to FIGS. 16-18, power system 302 is shown according to an exemplary embodiment. Power system 302 is substantially the same as power system 102, power system 202, or power system 252 except for the differences discussed herein.

In particular, one or more coupling mechanisms 330 are coupled to coupling structure 320. Coupling mechanism(s) 330 are biased upward in direction 332 so that coupling end 334 (e.g., a hook) secures coupling mechanism 330 to another object (e.g., dolly 316).

Referring to FIGS. 17-18, in use, coupling mechanism(s) 330 interface against lateral bar 318 of dolly 316, thereby securing coupling structure 320 to dolly 316. As a result, power unit 310 and coupling structure 320 are coupled to dolly 316.

Figure 20:
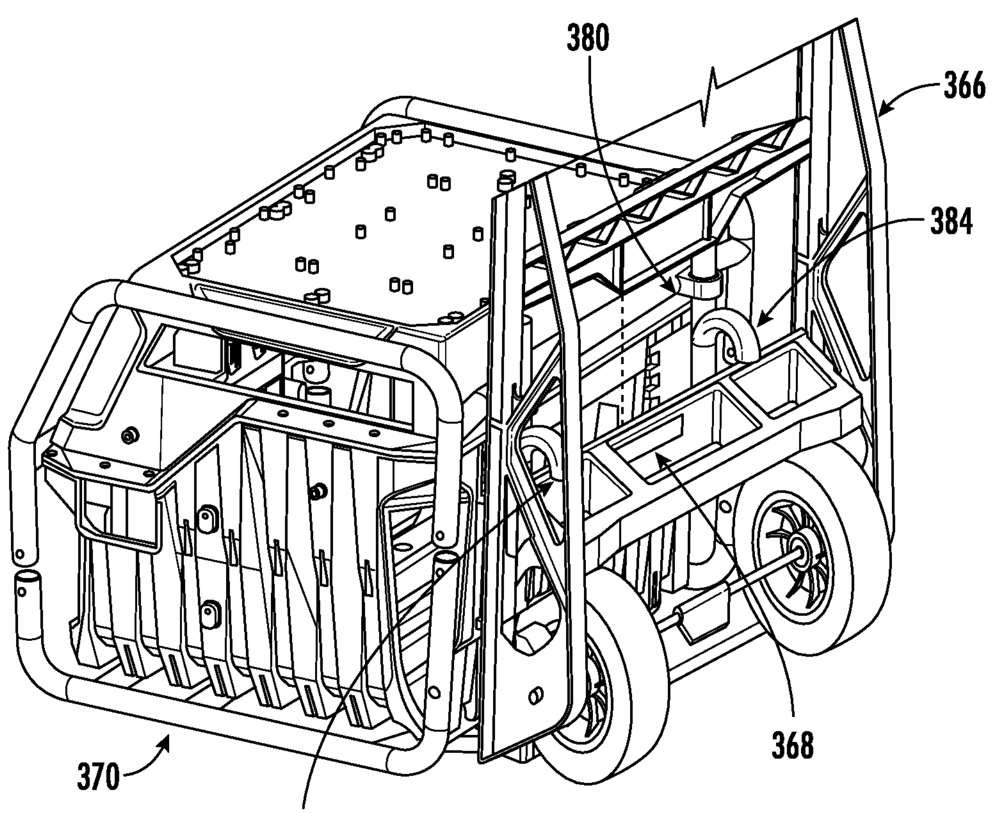
FIG. 20 is a perspective view of the power system of FIG. 19 shown coupled to a dolly, according to an exemplary embodiment.
Figure 21:
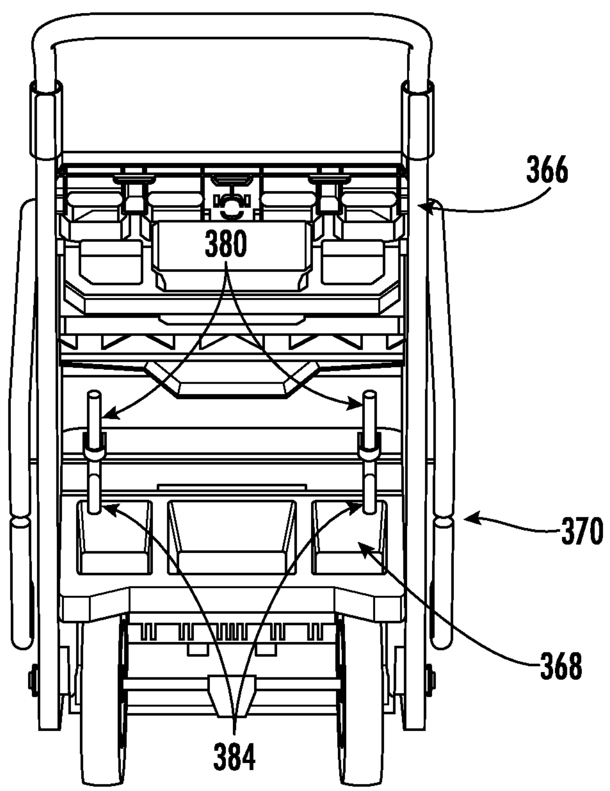
FIG. 21 is a rear view of the power system of FIG. 19 shown coupled to a dolly, according to an exemplary embodiment.

Referring to FIGS. 19-21, power system 352 is shown according to an exemplary embodiment. Power system 352 is substantially the same as power system 102, power system 202, power system 252, or power system 302 except for the differences discussed herein. In particular, power system 352 is similar to power system 302 except that the coupling structures are slightly different and reversed.

In particular, one or more coupling mechanisms 380 are coupled to coupling structure 370. Coupling mechanism(s) 380 are biased downward in direction 382 so that coupling end 384 (e.g., a hook) secures coupling mechanism 380 to another object (e.g., dolly 366).

Referring to FIGS. 20-21, in use, coupling mechanism(s) 380 interface against lateral bar 368 of dolly 366, thereby securing coupling structure 370 to dolly 366. As a result, power unit 360 and coupling structure 370 are coupled to dolly 366.

Figure 22:
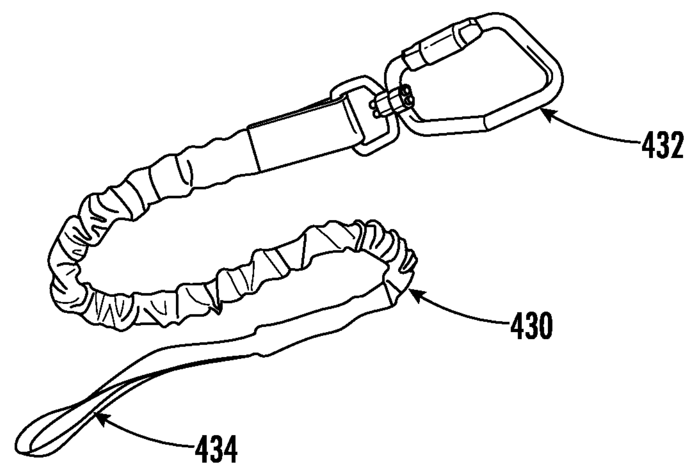
FIG. 22 is a perspective view of a coupling structure for a power system, according to an exemplary embodiment.
Figure 23:
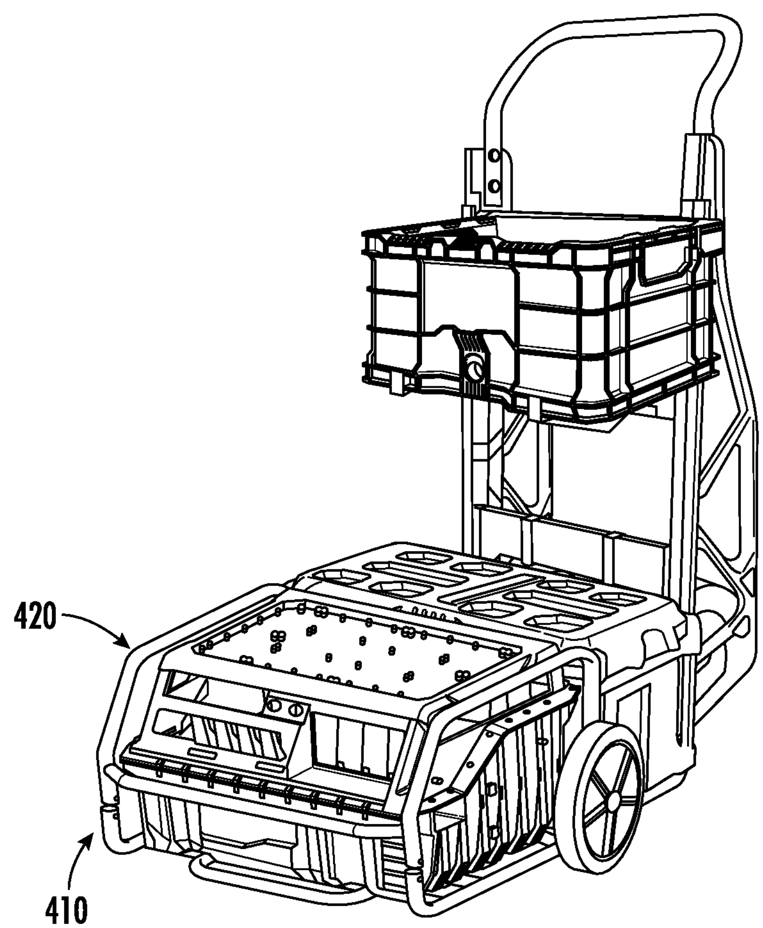
FIG. 23 is a perspective view of a power system within a modular system, according to an exemplary embodiment.

Referring to FIGS. 22-23, coupling structure 430 is configured to couple coupling structure 420 and power unit 410 to a transportation system. In various embodiments, coupling structure 430 is elongate and flexible, and optionally stretchable. In various embodiments, a coupling mechanism, such as carabiner 432 is coupled to one end of coupling structure 430, and another coupling mechanism, such as loop 434, is arranged at an opposing end of coupling structure 430.

In use, coupling structure 430 is used to couple power unit 410 to a transportation unit, such as by attaching one or both of the loop 434 and carabiner 432 to the dolly. The body of coupling structure 430 is arranged around power unit 410 such that coupling structure 430 biases power unit 410 towards the dolly.

In various embodiments, coupling structure 430 includes one or more of ratchet straps, and/or an anchor. In various embodiments, coupling structure 430 latches around the metal on front of a utility module, such as a utility module in a modular system (shown in FIG. 23). In various embodiments, coupling structure 430 couples a power unit to a front of a roll-on and the base or structure of a cart.

Figure 24:
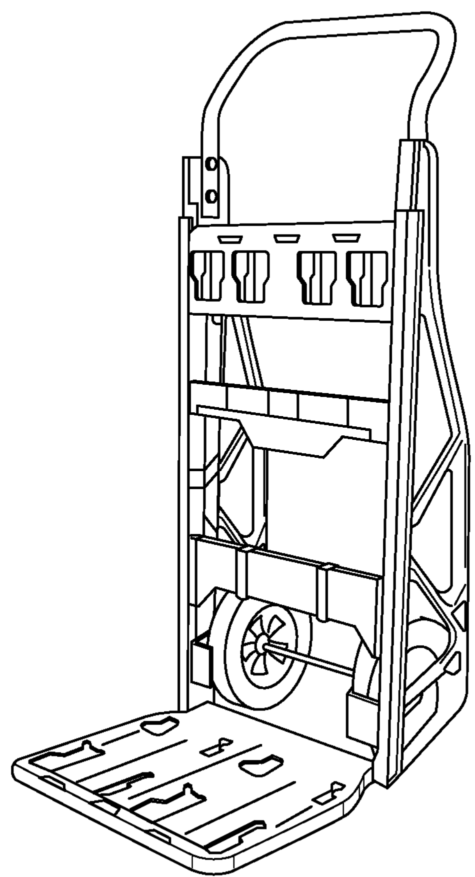
FIG. 24 is a perspective view of a dolly for use with one or more power systems described herein, according to an exemplary embodiment.
Figure 25:
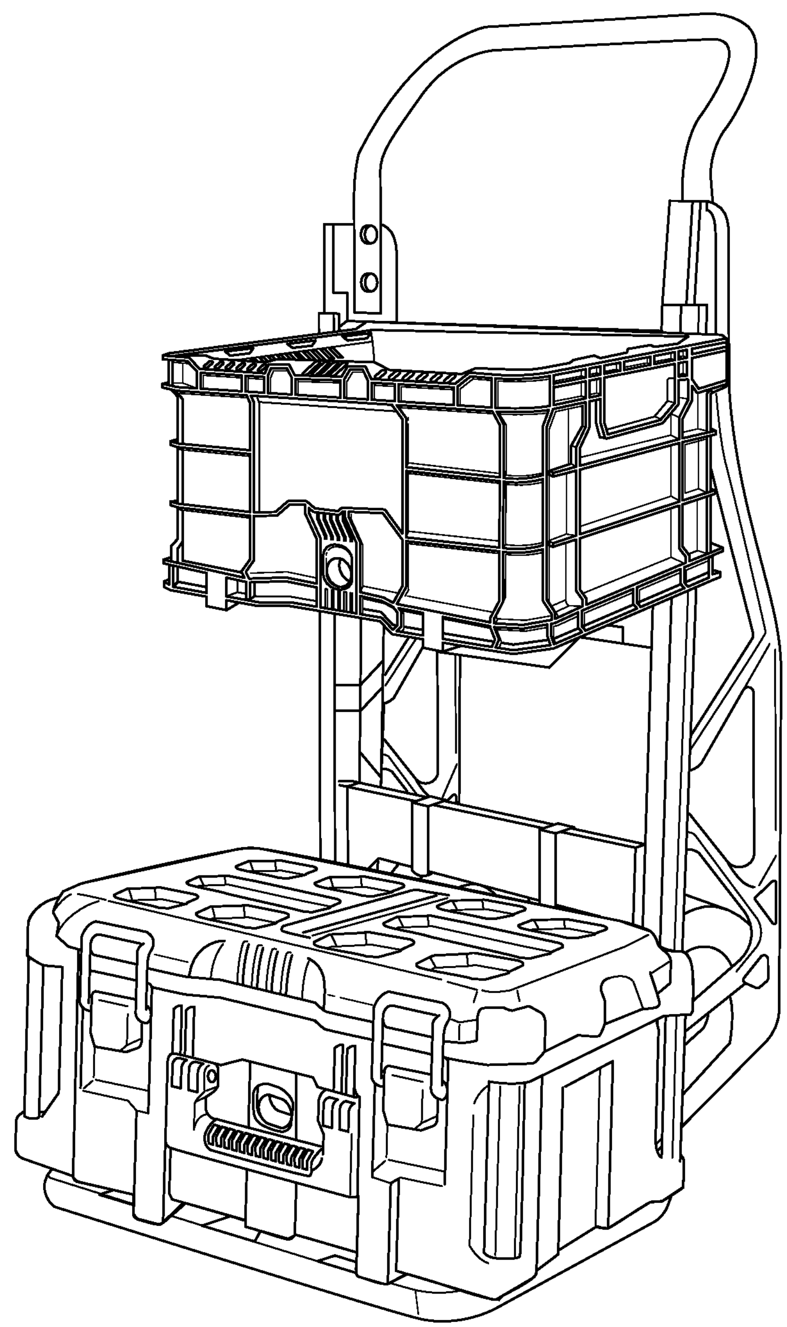
FIG. 25 is a perspective view of various components in a modular system, according to an exemplary embodiment.

Referring to FIGS. 24-25, various other structure and methods are described. Several examples for coupling a utility module to a transportation device include a coupling plate (e.g., including female couplers and/or male couplers) on the bottom of a utility module, a coupling plate on the back or sides, a wrap cage that traps a standard size utility module next to a main cart that is being pulled, a set of handles, a pair of wheels, and a coupling rack with no bottom deck.

Several more examples for coupling a utility module to a transportation device includes a reinforced dolly slot, an extension with male couplers and/or female couplers that grabs a roll-cage, stretchable cords, such as bungee cords, straps that clip to a utility module with male/female couplers and wrap around, and straps that clip to a utility module with male/female couplers and wrap around the handles. Several more examples for coupling a utility module to a transportation device include super strong magnets, adhesive, Velcro, a crane arm that clips into a utility module with male/female couplers on a dolly and to an MPS, a top deck of a utility module with male/female couplers instead of on the bottom, various elements that are de- and re-attachable, a utility module with male/female couplers on the back (e.g., facing the user), such as the entire way up, an object that grabs from sides, such as hydraulic arms, a trailer hitch dolly from MPS to a dolly, a mated bottom plate for dolly, such as one that fits a roll cage, and a handle and wheels that attach to back roll cage.

It should be understood that the figures illustrate the exemplary embodiments in detail, and it should be understood that the present application is not limited to the details or methodology set forth in the description or illustrated in the figures. It should also be understood that the terminology is for the purpose of description only and should not be regarded as limiting.

Further modifications and alternative embodiments of various aspects of the disclosure will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present disclosure.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one.

For purposes of this disclosure, the term "coupled" means the joining of two components directly or indirectly to one another. Such joining may be stationary in nature or movable in nature. Such joining may be achieved with the two members and any additional intermediate members being integrally formed as a single unitary body with one another or with the two members or the two members and any additional member being attached to one another. Such joining may be permanent in nature or alternatively may be removable or releasable in nature. As used herein, "rigidly coupled" refers to two components being coupled in a manner such that the components move together in a fixed positional relationship when acted upon by a force.

While the current application recites particular combinations of features in the claims appended hereto, various embodiments of the invention relate to any combination of any of the features described herein whether or not such combination is currently claimed, and any such combination of features may be claimed in this or future applications. Any of the features, elements, or components of any of the exemplary embodiments discussed above may be used alone or in combination with any of the features, elements, or components of any of the other embodiments discussed above.

In various exemplary embodiments, the relative dimensions, including angles, lengths and radii, as shown in the Figures are to scale. Actual measurements of the Figures will disclose relative dimensions, angles and proportions of the various exemplary embodiments. Various exemplary embodiments extend to various ranges around the absolute and relative dimensions, angles and proportions that may be determined from the Figures. Various exemplary embodiments include any combination of one or more relative dimensions or angles that may be determined from the Figures. Further, actual dimensions not expressly set out in this description can be determined by using the ratios of dimensions measured in the Figures in combination with the express dimensions set out in this description.

What is claimed is:

1. A power system comprising:

a power unit comprising a housing defining a lower surface, an upper surface opposite the lower surface, a height between the upper surface and lower surface, a power source within the housing, and a power tool battery interface configured to couple to a rechargeable power tool battery and provide power from the power source to the rechargeable power tool battery; and a coupling structure mechanically and reversibly detachably coupled to the power unit, the coupling structure extending vertically at least the height upward from below the lower surface of the power unit, the coupling structure comprising a plurality of male couplers, each of the plurality of male couplers comprising a body extending below and away from the lower surface, a first tongue, and a second tongue, the first tongue and the second tongue each extending from opposing sides of the body and each offset from the lower surface, the first tongue defining a first channel between the lower surface and the first tongue, the second tongue defining a second channel between the lower surface and the second tongue, each channel comprising a front open end and a back closed end, the plurality of male couplers configured to detachably couple the coupling structure to a utility module.

2. The power system of claim 1, wherein the coupling structure defines an empty internal volume that the coupling structure surrounds, and wherein the power unit being at least partially disposed within the internal volume.

3. The power system of claim 1, wherein the coupling structure defines an empty internal volume that the coupling structure surrounds, and wherein the power unit is disposed entirely within the internal volume.

4. The power system of claim 1, the power unit comprising a front face, a rear face opposite the front face, a first side face, and a second side face opposite the first side face, wherein the coupling structure comprises a first corner rail in front of the front face and the first side face, a second corner rail in front of the front face and the second side face, a third corner rail in front of the rear face and the first side face, and a fourth corner rail in front of the rear face and the second side face.

5. The power system of claim 4, the coupling structure comprising a front rail in front of the front face of the power unit, the front rail extending between the first corner rail and the second corner rail.

6. The power system of claim 4, the coupling structure comprising a first upper side rail extending between a top of the first corner rail and a top of the third corner rail, and a second upper side rail extending between a top of the second corner rail and a top of the fourth corner rail.

7. The power system of claim 1, the power unit comprising a storage compartment configured to store a hand tool.

8. The power system of claim 1, the power unit comprising a plurality of female couplers extending from the upper surface, each of the plurality of female couplers comprising a recessed surface, a first side wall, a second side wall opposite the first side wall, and a rear wall extending between the first side wall and the second side wall, each of the first side wall, the second side wall and the rear wall extending upward from the recessed surface, each of the plurality of female couplers comprising a rib extending from the rear wall above the upper surface.

9. The power system of claim 8, wherein the coupling structure does not extend above the upper surface of the power unit opposite the lower surface.

10. The power system of claim 1, the power unit comprising a plurality of female couplers extending from the upper surface opposite the lower surface, each of the plurality of female couplers comprising a recessed surface, a first side wall, a second side wall opposite the first side wall, and a rear wall extending between the first side wall and the second side wall, each of the first side wall, the second side wall and the rear wall extending upward from the recessed surface, each of the plurality of female couplers comprising a first rib extending from the first side wall and the rear wall above the upper surface, and a second rib extending from the second side wall and the rear wall above the upper surface, the plurality of female couplers configured to detachably couple the coupling structure to a second utility module.

11. The power system of claim 1, wherein the coupling structure does not extend above the upper surface of the power unit opposite the lower surface.

12. The power system of claim 1, comprising:

a first hook extending from a rear of the coupling structure, wherein the first hook is configured to detachably couple the coupling structure to a transportation unit.

13. A power system comprising:

a power unit comprising a housing defining a first lower surface, a power source within the housing, and a power tool battery interface configured to couple to a rechargeable power tool battery and provide power from the power source to the rechargeable power tool battery;

a frame defining an empty internal volume that the frame surrounds, the power unit being at least partially disposed within the internal volume;

a plate coupled to the frame, the plate supporting the first lower surface of the power unit, the plate defining a second lower surface facing away from the power unit; and a plurality of male couplers, each of the plurality of male couplers comprising a body extending below and away from the second lower surface, a first tongue, and a second tongue, the first tongue and the second tongue each extending from opposing sides of the body and each offset from the second lower surface, the first tongue defining a first channel between the second lower surface and the first tongue, the second tongue defining a second channel between the second lower surface and the second tongue, each channel comprising a front open end and a back closed end, the plurality of male couplers configured to detachably couple the plate to a utility module.

14. The power system of claim 13, wherein the frame does not extend above an upper surface of the power unit opposite the first lower surface.

15. The power system of claim 13, the power unit comprising a plurality of female couplers extending from an upper surface opposite the first lower surface, each of the plurality of female couplers comprising a recessed surface, a first side wall, a second side wall opposite the first side wall, and a rear wall extending between the first side wall and the second side wall, each of the first side wall, the second side wall and the rear wall extending upward from the recessed surface, each of the plurality of female couplers comprising a first rib extending from the first side wall and the rear wall above the upper surface, and a second rib extending from the second side wall and the rear wall above the upper surface, the plurality of female couplers configured to detachably couple the frame to the utility module.

16. The power system of claim 13, wherein the power unit is disposed entirely within the internal volume.

17. A coupling structure comprising:

a frame configured to detachably couple around a first utility module such that the first utility module is at least partially disposed within an empty internal volume that the frame surrounds;

a plate coupled to the frame, the plate supporting a lower surface of the first utility module; and a plurality of male couplers, each of the plurality of male couplers comprising a body extending downward, a first tongue, and a second tongue, the first tongue and the second tongue each extending from opposing sides of the body, the first tongue defining a first channel above the first tongue, the second tongue defining a second channel above the second tongue, each channel comprising a front open end and a back closed end, the plurality of male couplers configured to detachably couple the frame to a second utility module.

18. The coupling structure of claim 17, comprising:

a first hook extending from a rear of the frame, wherein the first hook is configured to detachably couple the frame to a transportation unit.

19. The coupling structure of claim 18, wherein the first hook is spring-biased to couple the frame to the transportation unit.

20. The coupling structure of claim 18, the frame comprising a first corner rail, a second corner rail opposite the first corner rail, a third corner rail, and a fourth corner rail opposite the third corner rail, wherein the first corner rail, the second corner rail, the third corner rail, and the fourth corner rail collectively define the internal volume.

* * * * *